US008963268B2

(12) United States Patent
Kim et al.

(10) Patent No.: US 8,963,268 B2
(45) Date of Patent: *Feb. 24, 2015

(54) FREE-STANDING TWO-SIDED DEVICES

(71) Applicant: University of Washington through its Center for Commercialization, Seattle, WA (US)

(72) Inventors: Samuel Kim, Austin, TX (US); Babak Amirparviz, Mountain View, CA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/791,321

(22) Filed: Mar. 8, 2013

(65) Prior Publication Data
US 2013/0270664 A1    Oct. 17, 2013

Related U.S. Application Data

(62) Division of application No. 12/742,081, filed as application No. PCT/US2008/082827 on Nov. 7, 2008, now Pat. No. 8,394,660.

(60) Provisional application No. 60/986,197, filed on Nov. 7, 2007.

(51) Int. Cl.
*H01L 31/0232* (2014.01)
*H01L 31/0216* (2014.01)
(Continued)

(52) U.S. Cl.
CPC ........ *H01L 31/02165* (2013.01); *H01L 31/103* (2013.01); *H01L 31/1035* (2013.01);
(Continued)

(58) Field of Classification Search
CPC .................. H01L 31/0224; H01L 31/022416; H01L 31/02165
USPC .................................... 257/431, 432, E31.123
See application file for complete search history.

(56) References Cited

U.S. PATENT DOCUMENTS

2003/0164547 A1*  9/2003  Kurita ........................... 257/736
2005/0062119 A1   3/2005  Gallup
(Continued)

OTHER PUBLICATIONS

International Search Report mailed Jan. 12, 2009, issued in corresponding International Application No. PCT/US2008/82827, filed Nov. 7, 2008, 1 page.
Corrected International Preliminary Report on Patentability mailed May 5, 2011, issued in corresponding International Application No. PCT/US2008/82827, filed Nov. 7, 2008, 7 pages.

*Primary Examiner* — Daniel Whalen
(74) *Attorney, Agent, or Firm* — Christensen O'Connor Johnson Kindness PLLC

(57) ABSTRACT

Devices having features deposited on two sides of a device substrate and methods for making the same. The devices are useful, for example, as the components in a macroelectronic system. In a preferred embodiment, the devices are photosensors having a plurality of electrodes patterned on a first side of the device and an electromagnetic interference filter patterned on a second side of the device. The method facilitates the fabrication of two-sided devices through the use of an immobilizing layer deposited on top of devices patterned on a first side of a device substrate; flipping the device substrate; processing the second side of the device substrate to produce patterned features on the second side of the device substrate; and releasing the devices having patterned elements on two sides of each device.

16 Claims, 6 Drawing Sheets

(51) Int. Cl.
H01L 31/103 (2006.01)
H01L 31/18 (2006.01)

(52) U.S. Cl.
CPC ........ *H01L31/1804* (2013.01); *H01L 31/1812* (2013.01); *H01L 31/184* (2013.01); *H01L 31/1852* (2013.01); *Y02E 10/544* (2013.01); *Y02E 10/547* (2013.01)
USPC .................................. 257/432; 257/E31.123

(56) References Cited

U.S. PATENT DOCUMENTS

| | | |
|---|---|---|
| 2005/0233493 A1 | 10/2005 | Augusto |
| 2006/0138605 A1 | 6/2006 | Pardo |
| 2006/0257792 A1 | 11/2006 | Krause |
| 2007/0018075 A1* | 1/2007 | Cazaux et al. ............. 250/208.1 |
| 2008/0061330 A1* | 3/2008 | Shiau et al. ................... 257/294 |
| 2008/0284037 A1* | 11/2008 | Andry et al. .................. 257/774 |

* cited by examiner

FREE-STANDING TWO-SIDED DEVICES

CROSS-REFERENCES TO RELATED APPLICATIONS

This application is a division of U.S. application Ser. No. 12/742,081, filed Sep. 15, 2010, which is the national stage of International Application No. PCT/US2008/082827, filed Nov. 7, 2008, which claims the benefit of U.S. Provisional Patent Application No. 60/986,197, filed Nov. 7, 2007, the disclosures of which are hereby expressly incorporated by reference in their entirety.

STATEMENT OF GOVERNMENT LICENSE RIGHTS

This invention was made with government support under 7P50HG002360-06 awarded by the National Institutes of Health. The government has certain rights in the invention.

BACKGROUND

Self-assembly has emerged as a powerful fabrication technology for fabricating macroelectronic devices. Macrofabrication technologies typically integrate a large number of various functional components over areas exceeding the size of a typical semiconductor wafer and do so in a cost-effective and time-efficient fashion. A typical self-assembly macrofabrication technique includes functional devices that are batch microfabricated (for example, on a semiconductor substrate) and released to yield a collection of free-standing components. These components are then allowed to self-assemble onto a template, for example, on a plastic substrate, to yield a functional macroelectronic system. Because self-assembly is an inherently parallel construction method, it allows for cost-effective and time-efficient integration of a large number of functional components onto both conventional (e.g., semiconductor) and unconventional (e.g., plastic) substrates.

An additional benefit of self-assembled macrofabrication is that it allows for the integration of components made from incompatible microfabrication processes (e.g., light-emitting diodes made in compound semiconductor substrates and silicon transistors) onto nonplanar and/or flexible substrates.

The components of a self-assembly based macroelectronic fabrication system typically include: (1) the development of fabrication processes that generate free-standing functional components; (2) the implementation of recognition/binding capabilities to guide the components to bind in the correct location; and (3) the determination of self-assembly procedures/conditions that result in a final assembled system with a high yield of components in correct locations. An exemplary fluidic self-assembly method is disclosed in International Patent Application No. PCT/US2007/072038, filed Jun. 25, 2007, which is hereby incorporated by reference in its entirety. Additionally, fluidic self-assembly has been used to fabricate macro-scale electronics comprising an integrated optical analysis system in International Application No. PCT/US2008/050104, which is also hereby incorporated by reference in its entirety.

Briefly, the above-referenced international patent applications describe a method for self-assembly that accomplishes the assembly process in one step, obviating or mitigating the need for post-processing of an assembled macro-electronic device. Microcomponents are fabricated having a particular shape, and a template with embedded interconnects is fabricated having recessed binding sites that are sized to receive particular microcomponent types. The binding sites include a low melting point alloy for electrically connecting received microcomponents to the interconnect network. The template is placed in a liquid, and the microcomponents are introduced to the liquid such that the microcomponents flow or slide along the template propelled by gravity and/or fluid-dynamic forces and some of them are received into the binding sites, and retained by capillary forces. The liquid is heated before or after introduction of the microcomponents to melt the alloy. The fluid and/or template are then cooled to harden the alloy, binding the microcomponents.

Prior macro-scale self-assembly techniques have produced macroelectronic devices having structures such as light-emitting diodes, photosensors, and transistors, to name a few. One aspect of previous macroelectronic self-assembled devices is the limitation of fabrication to patterning features on one side of a device. In a typical fabrication procedure for components for macro-scale self-assembly, micron-scale devices are patterned on a substrate and then released for self-assembly.

Given traditional microelectronic fabrication techniques, it is not surprising that only one side of the micron scale devices can be patterned, because only the top side of a substrate is typically processed in microfabrication. This remains true when fabricating micron-scale devices for macroelectronic self-assembly, in that only the top side of a device is typically patterned and processed to create the device structure. The eventual bottom side of the device is buried within (or adjacent to) the carrier substrate during processing, and the bottom of the device is only revealed once the devices are released from the carrier substrate, at which point the devices are individually articulated and batch processing of a plurality of such devices would be nearly impossible.

A processing technique enabling the patterning of both the top and bottom sides of micron-scale devices for fluidic self-assembly of macroelectronics would enable more complex devices (both on the micro and macro-scale) and increase the number of currently available types of device structures. By allowing more complex features to be integrated onto macroelectronic devices, the functions of such devices will potentially be improved, expanded, and enhanced.

SUMMARY

In one aspect, a fabrication method is provided for processing features on two sides of a device substrate. In one embodiment, the method includes the steps of processing a first side of a device substrate such that at least one device area is formed; coating the first side of the device substrate with a immobilizing material to provide an immobilizing layer; inverting the device substrate to provide processing access to a second side of the device substrate; removing material from the second side of the device substrate until the device substrate supporting the at least one device area is a desired thickness, wherein the second side of the device substrate is opposite the first side of the device substrate; processing the second side of the device substrate, including the at least one device area; and removing the immobilizing layer to provide at least one device having processed features on both a first side of the device and a second side of the device, wherein the first side of the device is opposite the second side of the device.

In one embodiment, a device fabricated by the method of invention is provided. The device is fabricated on a substrate having a first device side and a second device side, wherein the first device side is opposite the second device side, and wherein the device has features disposed on both the first device side and the second device side. In a further embodiment, the device is a photosensor having a plurality of electrodes patterned on the first device side and an interference filter deposited on the second side of the device.

In another aspect, a free-standing photosensor is provided, comprising a first side having an outer electrode surrounding an inner electrode and a second side having an electromagnetic filter, wherein the photosensor is adapted for self-assembly onto a substrate through a self-assembly means.

In another aspect, a semiconductor device is provided that is fabricated from a silicon-on-insulator substrate including a device layer, a buried oxide layer, and a carrier layer, wherein the device is fabricated in the device layer, the device having device features disposed on both a top side of the device and a bottom side of the device, and wherein the features on the bottom side of the device are formed after removal of the buried oxide layer and the carrier layer.

In another aspect, a device is provided that is fabricated on a substrate having a first device side and a second device side, wherein the first device side is opposite the second device side, wherein the device has features disposed on both the first device side and the second device side, wherein the substrate has a thickness dimension of less than about 50 microns.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The present invention provides devices having features deposited on two sides of a device substrate, and methods for making the same. The devices are useful, for example, as the components in a macroelectronic system. The devices are also useful in microelectronic systems. In a preferred embodiment, the devices are photosensors having a plurality of electrodes patterned on a first side of the device and an electromagnetic interference filter patterned on a second side of the device. The method facilitates the fabrication of two-sided micro components through the use of an immobilizing layer deposited on top of devices patterned on a first side of a device substrate; flipping the device substrate; processing the second side of the device substrate to produce patterned features on the second side of the device substrate; and releasing the devices having patterned elements on two sides of each device.

In one aspect, a fabrication method is provided for processing features on two sides of a device substrate. In one embodiment, the method includes the steps of processing a first side of a device substrate such that at least one device area is formed; coating the first side of the device substrate with a immobilizing material to provide an immobilizing layer; inverting the device substrate to provide processing access to a second side of the device substrate; removing material from the second side of the device substrate until the device substrate supporting the at least one device area is a desired thickness, wherein the second side of the device substrate is opposite the first side of the device substrate; processing the second side of the device substrate, including the at least one device area; and removing the immobilizing layer to provide at least one device having processed features on both a first side of the device and a second side of the device, wherein the first side of the device is opposite the second side of the device.

Figure 1:
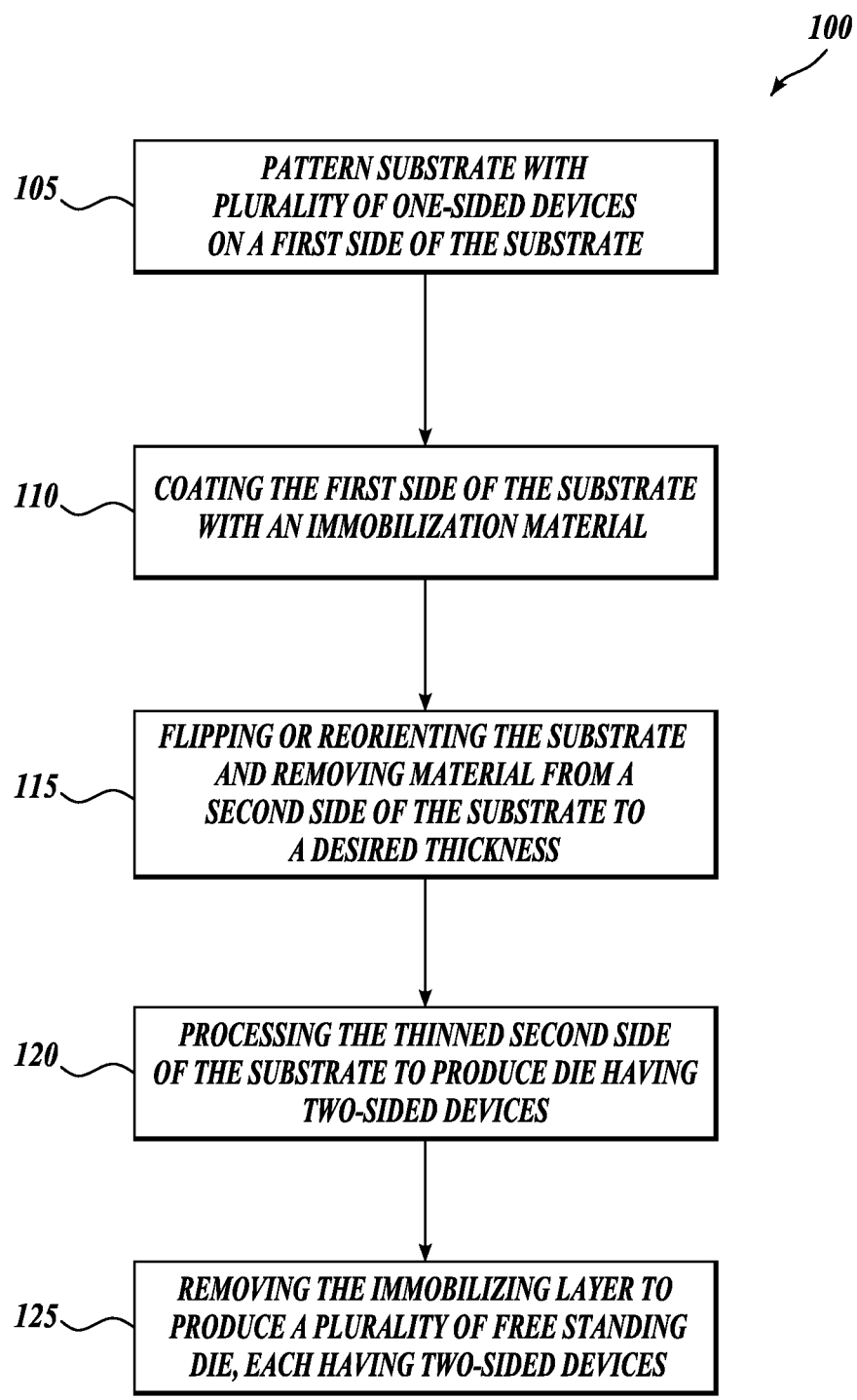
FIG. 1 is a flow chart of a representative method for fabricating a device having processed features on two sides of the device, in accordance with the present invention.

The method will be better understood with reference to FIG. 1, a flow chart describing the steps of the method 100. The method 100 begins with patterning a plurality of one-sided devices on a first side of a substrate 105. The substrate can be any material known to those of skill in the art as being processable by semiconductor processing techniques, including but not limited to crystalline and polycrystalline semiconductors, glass, polymer, and ceramics. Representative semiconductor processing techniques include lithography (e.g., photolithography and soft lithography), thin film deposition techniques (e.g., spin coating, vapor deposition, sputtering, and electron beam deposition), and etching (e.g., reactive ion etching and solvent etching). Typical substrates include semiconductor substrates, such as silicon, doped silicon, silicon-on-insulator (SOI), III-V semiconductors (e.g., gallium arsenide); polymer substrates; glasses and other inorganic substrates; and composite substrates that include two or more materials. Substrates having buried layers (e.g., the oxide layer of an SOI wafer) comprised of a different material than the bulk of the substrate are useful because the buried layer can act as an etch stop during processing, as described in more detail below.

A plurality of one-sided devices are typically patterned on the substrate, each device being the same or one of a plurality of different devices. Devices can be any electronic, optical, optoelectronic, or any other device known to those of skill in the art. Because the final product of the method 100 is a two-sided device, typical devices include those devices that require, or are enhanced by, having features patterned on a second side of the device (other than that exposed and patterned at the beginning of the method 100). A representative example of a two-sided device is a photosensor having electrodes patterned on a first side and an electromagnetic filter patterned on the second side, as will be described in more detail below.

The first side of the substrate is then coated with an immobilizing material 110 that is typically also a planarizing material. The material is typically deposited in a liquid or vapor form. Any immobilizing material can be used as long as it suitably immobilizes the patterned devices, and allows the substrate to be processed as further described in the method 100. Typical immobilizing materials include polymethylmethacrylate (PMMA) and polydimethyl siloxane (PDMS).

Because further steps of the method (115, 120, and 125) require the substrate to be "flipped" or otherwise reoriented for processing on a second side, the immobilizing layer is typically augmented by attaching an immobilizing substrate, or "handle" wafer to the immobilizing layer. The immobilizing substrate tightly binds to the immobilizing layer, thus allowing the device substrate and immobilizing layer to be reoriented, e.g., flipped such that a second side of the device substrate is accessible for processing.

The method 100 continues in block 115, where the flipping of the substrate and subsequent processing proceeds. Using similar semiconductor processing techniques as those described above, the substrate is processed such that material is removed from the device substrate in those areas desired by the user (typically through the use of lithographic patterning and etching techniques) until the device substrate has a desired thickness.

In a current embodiment, the desired thickness of the device substrate is on the order of nanometers or micrometers. In a representative embodiment, the desired thickness of the device substrate is less than 50 microns. In a representative embodiment, the substrate is an SOI wafer having a top device layer of silicon, a middle layer of silicon dioxide, and a bottom carrier layer of silicon. The substrate is flipped such that the bottom carrier layer is accessible, e.g., oriented as the top surface and the carrier silicon is patterned using photolithography and etched using reactive ion etching. Because silicon and silicon dioxide are etched at different rates by typical reactive ion etching processes, the etching process essentially ceases when the carrier silicon is completely etched and the middle silicon dioxide layer is exposed. The silicon dioxide layer is then solvent etched (for example, with hydrofluoric acid), finally revealing the underside of the device layer of the SOI substrate. Thus, in this representative example, the depth to which the device substrate is thinned in the step of block 115 directly correlates to the thickness of the device layer of the SOI wafer.

The second side of the thinned device substrate is then processed 120. Further processing of the exposed second side of the device proceeds using processing techniques known to those of skill in the art as described above. The product of the processing in block 120 is a plurality of die, each having at least one device having features patterned on both a top side and bottom side of the device substrate. In representative examples discussed herein, such as photosensors, the device features on both sides combine to enhance or enable the device properties. For the exemplary photosensors, the electrodes patterned on the first side of the photosensor help to attach the photosensor to a substrate for macroelectronic devices (e.g., through self-assembly) and also to drive the photosensing function of the device. In this representative example, a filter is patterned on the second side of the photosensor, which enables the selection of the wavelength of electromagnetic radiation that impinges on the photosensor, thus acting as a wavelength filter for the device.

In other exemplary embodiments of two-sided devices, the devices can be in communication (e.g., electronic or optical) between the first side and the second side of the device. Or, the sides can be separate, with each side having a function independent of the other. Vias can be passed through the substrate of the device, electrically connecting the first side and the second side of the device, or semiconducting and/or insulating regions can be created in the device substrate.

In the final step of the method 100 at block 125, the immobilizing layer is removed to produce free-standing die. By removing the immobilizing layer, the individual die having two-sided devices are released from their processing carriers (i.e., the immobilizing layer and any attached substrate) such that the individual devices are no longer physically attached to other devices. Removing the immobilizing layer typically includes a solvent bath that dissolves the immobilizing layer. In a representative example, when the immobilizing layer is PMMA, an organic solvent (such as acetone) can be used to dissolve the immobilizing layer and release the die.

After the two-sided devices have been fabricated using the method 100, such devices may be useful, for example, in fluidic self-assembly systems, such as those described above with regards to International Patent Application Nos. PCT/US2007/072038 and PCT/US2008/050104.

Figure 2A:
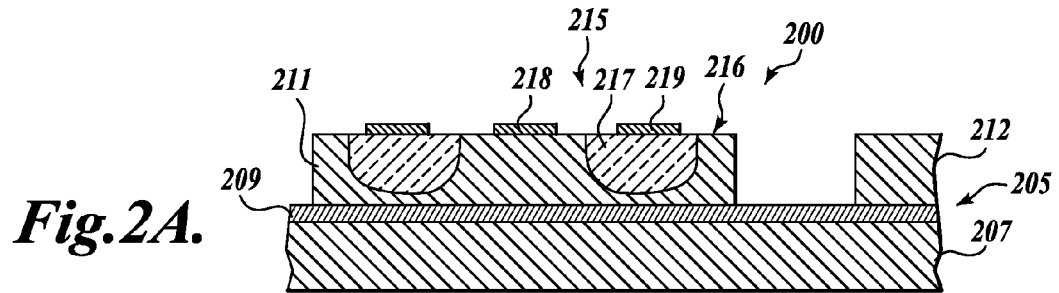
FIGS. 2A-2H illustrate the fabrication of a representative two-sided device in accordance with the method illustrated in FIG. 1.

The method described with regard to FIG. 1 will now be more specifically applied to a representative device fabrication of a photosensor having electrodes disposed on one side of the device and an electromagnetic filter disposed on the second side of the device. Referring now to FIG. 2A, a device substrate 200 includes an SOI wafer 205 from which a representative one-sided device 215 is fabricated, the one-sided device 215 having a first side 216 facing upwards. The SOI wafer 205 has a carrier layer 207, a buried oxide layer 209, and a device layer 211, in which the one-sided device 215 is formed. The one-sided device 215, in this exemplary embodiment, is a photosensor having a doped annular silicon region 217, an annular electrode 219, and a center electrode 218. In this representative example, the device layer 211 of the SOI wafer 205 is a p-type semiconductor substrate (such as boron-doped silicon), and the doped regions 217 include an n-type dopant (such as phosphorus). An edge portion of a neighboring device 212 is also shown.

As illustrated in FIG. 2A, the patterned device substrate 200 includes one one-sided photosensor device 215, which remains attached to the SOI substrate 205 at the oxide layer 209.

Figure 2B:
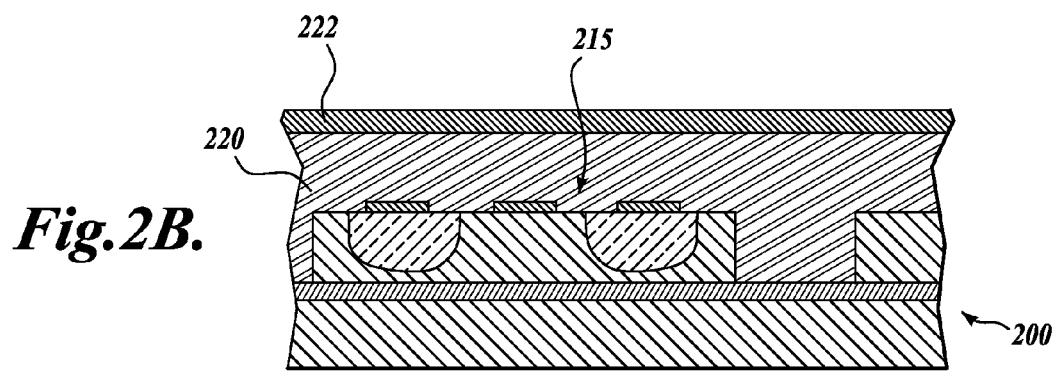

Referring now to FIG. 2B, an immobilizing layer 220 is deposited on top of the device substrate 200, including the attached one-sided photosensor device 215. As shown in FIG. 2B, an optional handle wafer 222 is attached to the immobilization layer 220 to aid in further processing steps. While only one photosensor device 215 is illustrated, it will be appreciated that the FIGS. 2A-2H show only a portion of the device substrate 205, which typically contains multiple devices (e.g., neighboring device 212), and can include multiple types of multiple devices. Although a single complete device is shown in FIGS. 2A-2H, the method is not limited to such.

Figure 2C:
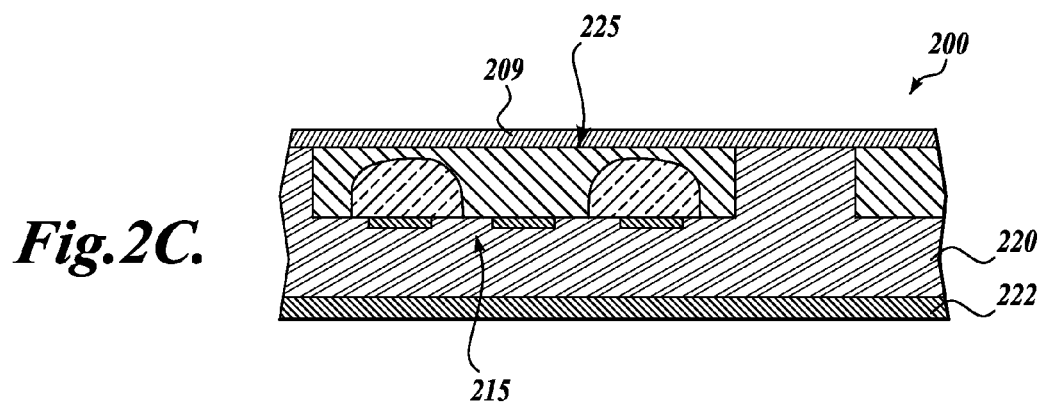

Referring now to FIG. 2C, the entire device substrate 200, immobilization layer 220, and handle 222 have been flipped or otherwise reoriented such that the handle 222 is the "bottom" layer of the device substrate 200. In FIG. 2C, the carrier layer 207 has been patterned (for example, by photolithography) and etched (for example, by reactive ion etching) such that a second side 225 of the photosensor device 215 has had the carrier layer 207 above it etched until only the oxide layer 209 remains above the device 215. Portions of the carrier layer 207 may remain on the oxide layer 209, although the no carrier layer 207 remains in the embodiment illustrated in FIG. 2C.

Figure 2D:
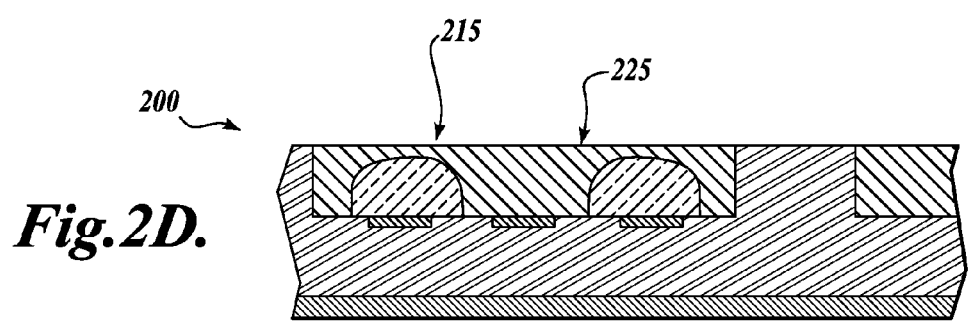

Referring now to FIG. 2D, the oxide layer 209 is etched, typically by a solvent-based process, such as hydrofluoric-acid etching. With the removal of the oxide layer 209, any the remaining portions of the carrier layer 207 (not illustrated) on the device substrate 200 are removed and the second side 225 of the photosensor device 215 is exposed for further processing.

Figure 2E:
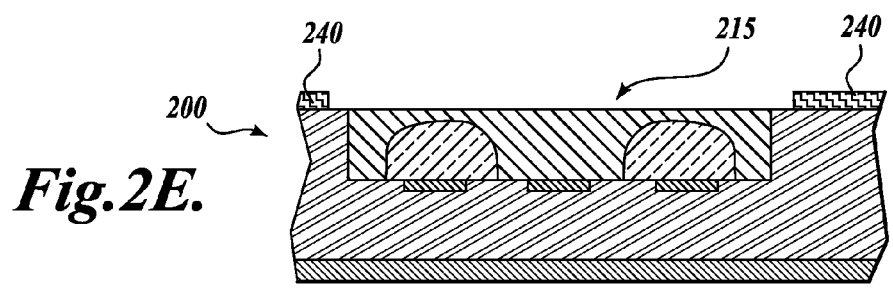

Referring now to FIG. 2E, a lithographic mask 240 is shown having patterned areas covering portions of the device substrate 200 but leaving the area above the photosensor device 215 exposed for further processing.

Figure 2F:
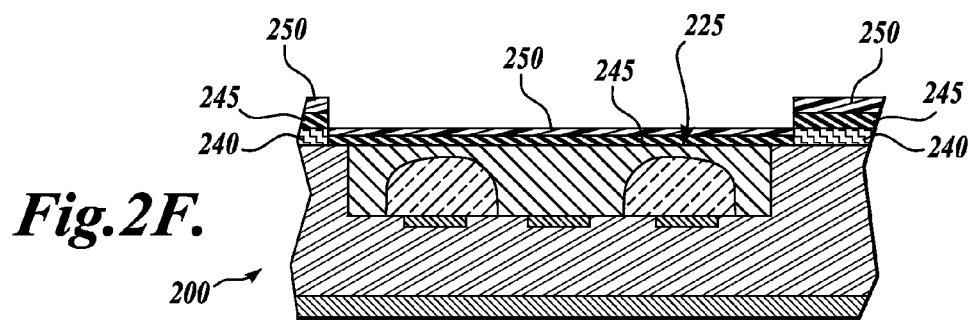
Figure 2G:
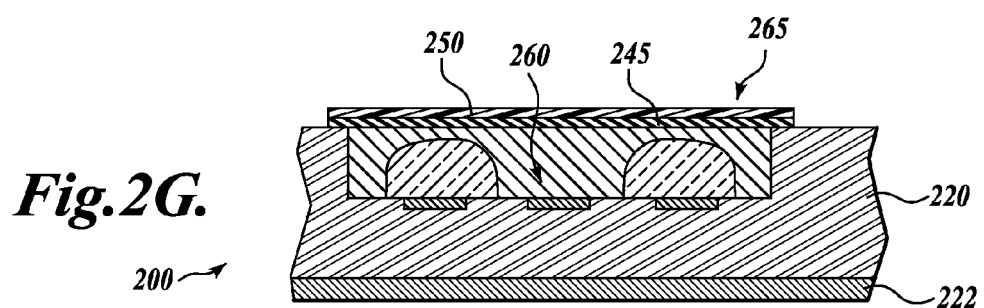
Figure 2H:
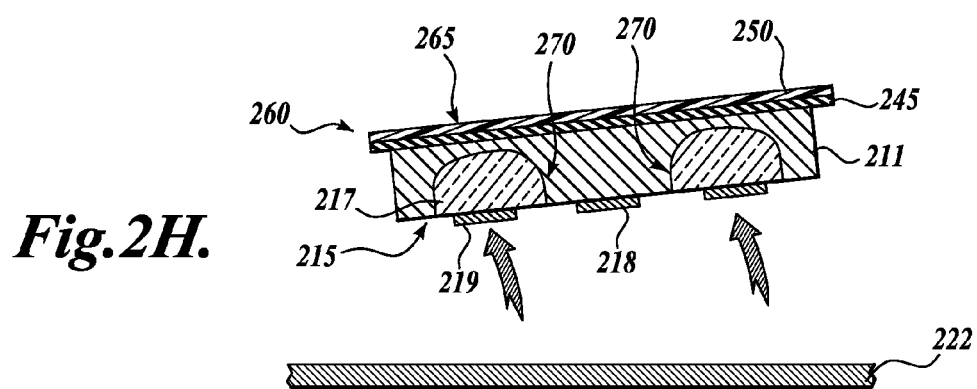

Referring now to FIG. 2F, thin film deposition is used to deposit multiple layers of materials 245 and 250 having different dielectric constants. The thin film layers 245 and 250 are useful as an electromagnetic filter (such as an interference filter), and typically such a filter requires a plurality of alternating thin film layers of materials having distinct dielectric constants. While only one bilayer (245 and 250) is illustrated in FIGS. 2F-2H, for simplicity, a typical interference filter would have several more alternating layers of layer 245 and layer 250. The layers 245 and 250 are deposited on the second side 225 of the device 215 and also on top of the patterned photomask 240.

Referring now to FIG. 2G, the photomask 240 illustrated in FIG. 2F has been used as a lift off mask, and the bilayer 245 and 250 covering the photomask 240 is removed from the device substrate 200 when the photomask is exposed to an appropriate solvent to dissolve the photomask material. The remaining structure, illustrated in FIG. 2G, is a filtered photosensor device 260 having an articulated bilayer 245 and 250 covering the second side 225 of the filtered photosensor device 260.

Finally, as illustrated in FIG. 2H, the completed device 260 is released by etching (or dissolving) the immobilization layer 220 to an extent that allows for the release of the immobilized devices 260 as individual die.

The released photosensor devices 260 are fully functioning photosensor devices having features patterned on two sides (215 and 225) of the device, wherein the two sides are opposite of each other. On the first side 215 of the device, electrodes 218, 219 are patterned, and on the second side 225 of the device, an electromagnetic filter 265 is comprised of a bilayer of two thin films 245 and 250 having distinct dielectric constants. A p-n junction 270 is created in the device 260 through the use of a p-doped substrate 211 and n-doped regions 217. Light impinging on the device from the side of the filter 265 will be selectively filtered, based on wavelength, in a manner known to those of skill in the art. The thicknesses and compositions of the layers 245 and 250 of the filter 265 determine the filter 265 properties. A plurality of free-standing photosensor devices 260 can further be self-assembled onto a macroelectronic substrate to form a portion of a macroelectronic device.

Figure 3:
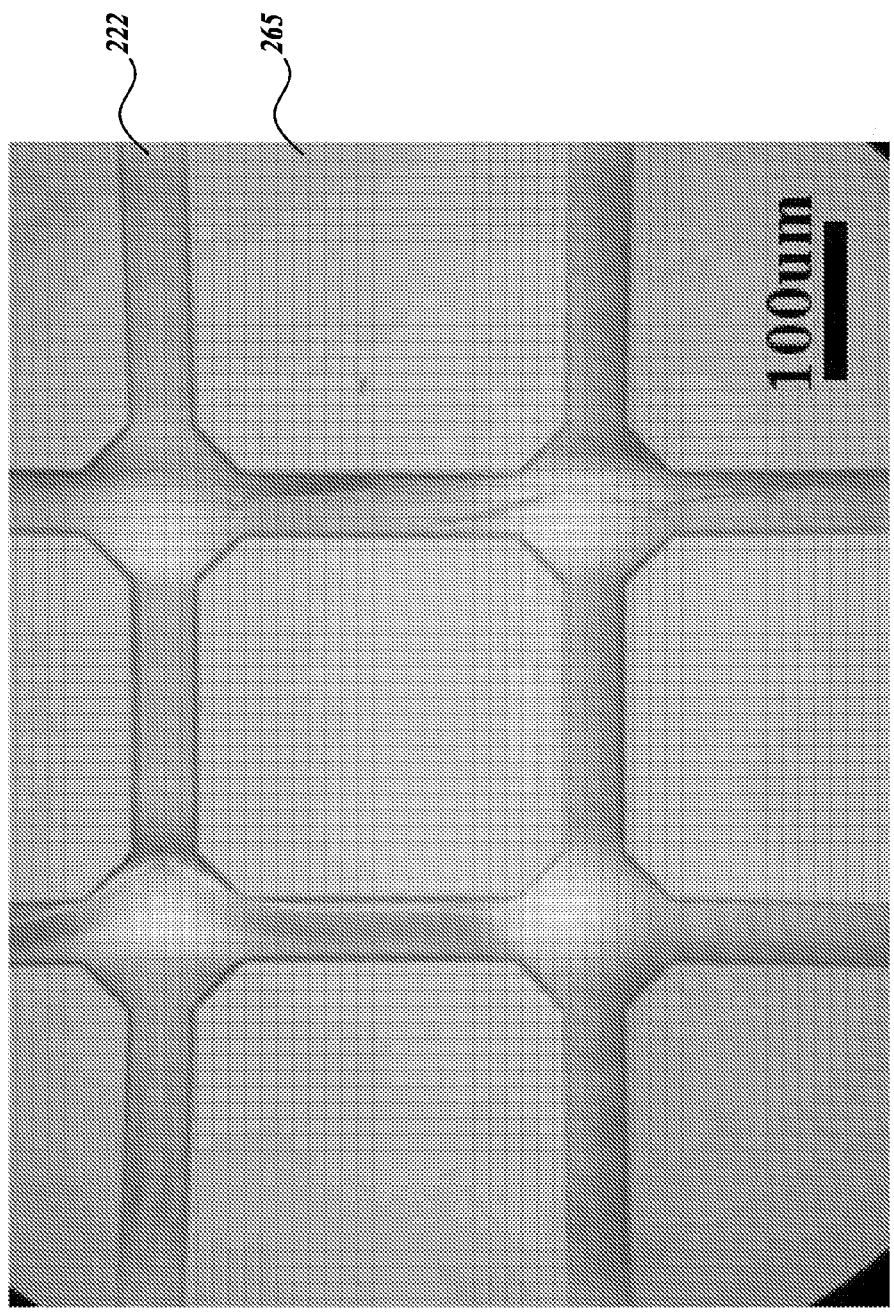
FIG. 3 is a micrograph of representative photosensor devices prior to release from a substrate after partial fabrication in accordance with the method of the invention.

Referring now to FIG. 3, a micrograph is shown of a representative substrate fabricated by a partial method as described herein. In the micrograph, the electromagnetic filters 265 as described with regard to FIGS. 2G and 2H can be seen. Because this micrograph is an image captured during a portion of fabrication of photosensor devices, as described in conjunction with FIGS. 2A-2H, it will be appreciated that FIG. 3 is an image corresponding substantially to the diagrammatic depiction of FIG. 2G. Looking at the device substrate 200 in plan view, the micrograph in FIG. 3 shows the electromagnetic filter 265 and the immobilization layer 222 in between the articulated devices.

Figure 4:
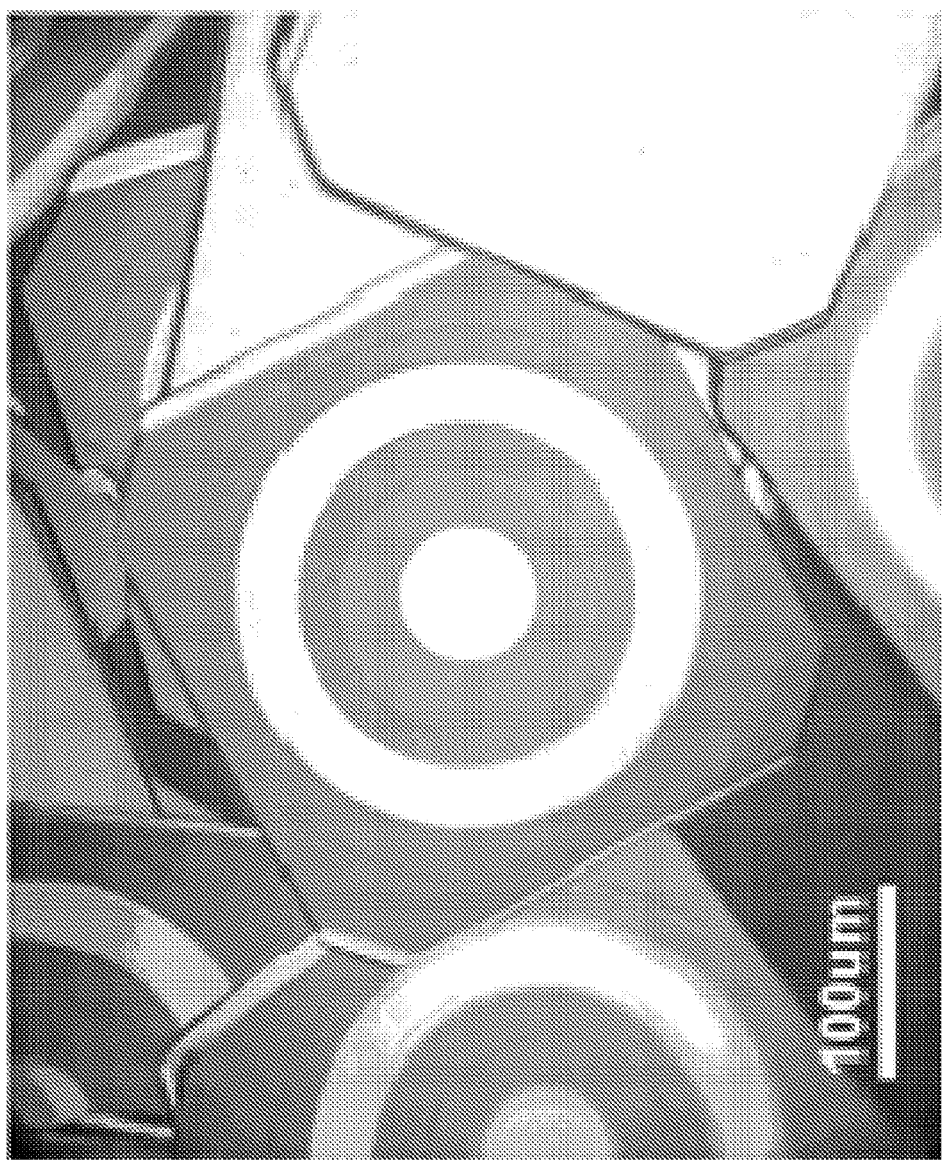
FIG. 4 is a micrograph of multiple free-standing photosensor elements in accordance with the present invention having integrated filter elements, wherein the electrodes form a target pattern on a first side of the device and the photosensor filter is formed on the second side of the device.

Referring now to FIG. 4, released two-sided photosensor component die (e.g., devices 260 as illustrated in FIG. 2H) are shown in the micrograph. The target-like structure corresponds to electrodes on the photosensor (e.g., 219), and the homogenous colored sides of the devices are electromagnetic filter elements (e.g., 265).

Figure 5:
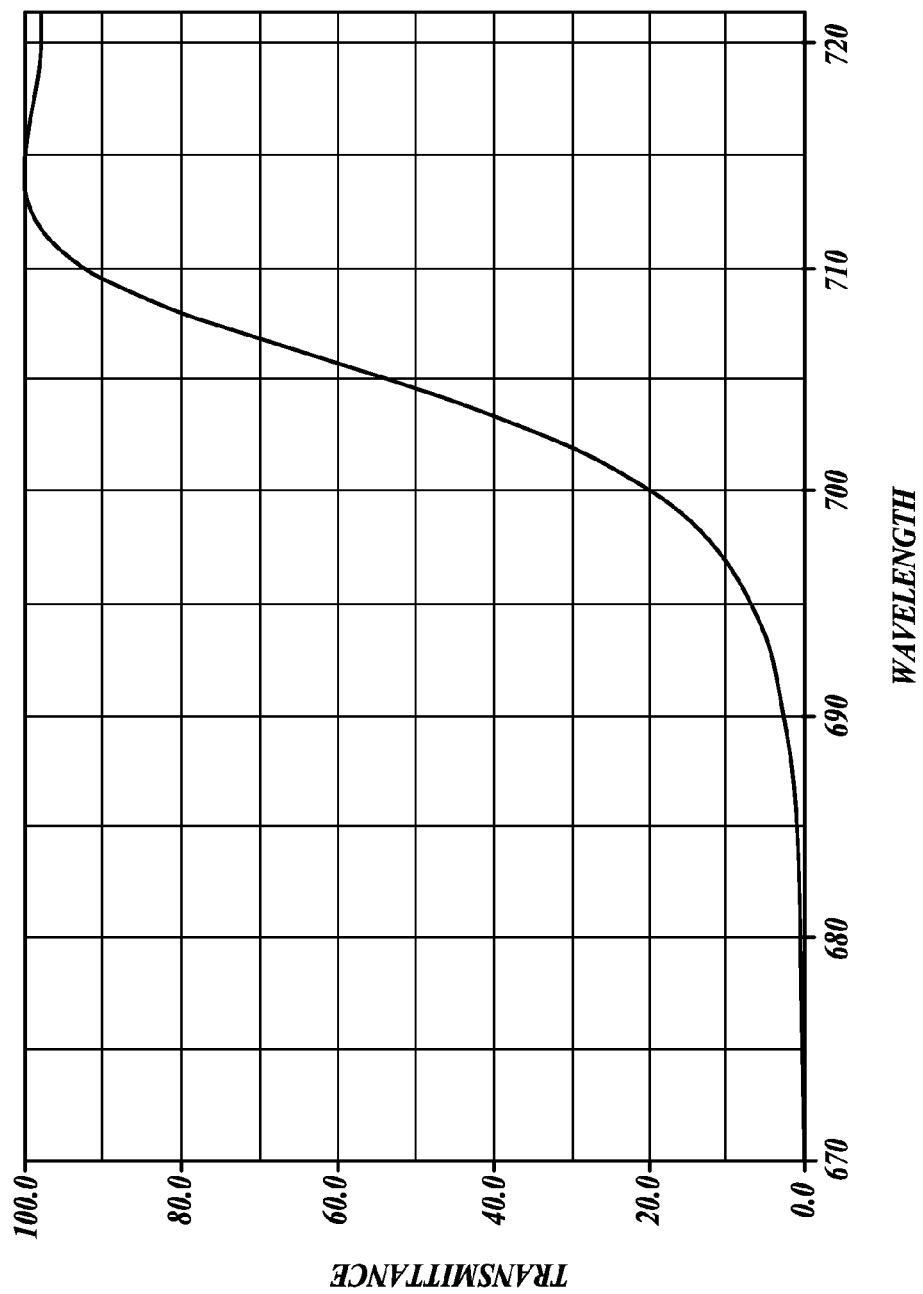
FIG. 5 is a chart plotting the transmittance characteristics of a representative electromagnetic filter formed on one side of a two-sided device in accordance with the present invention.

Referring now to FIG. 5, a transmittance versus wavelength chart for a representative photosensor is illustrated. The filter allows only wavelengths greater than about 700 nanometers to pass through the filter. The filter analyzed in FIG. 5 was fabricated using the method described herein with regard to FIG. 1 and FIGS. 2A-H. The filter was fabricated by depositing about twelve bilayers comprising alternating layers of silicon dioxide and tantalum pentoxide, wherein each bilayer includes about 80 nanometers of tantalum pentoxide and about 108 nanometers of silicon dioxide. In this representative example, both oxide layers were fabricated using a low-temperature deposition process where the temperature did not exceed 100 degrees Celsius, so as to not damage the immobilization layer (e.g., PDMS).

The immobilization layer has been previously described and can include polymers such as PMMA and PDMS. It will be appreciated that PDMS is a preferred immobilization layer for many applications because of its resistance to many of the chemicals used in semiconductor manufacturing processes. For example, acetone is an organic solvent commonly used to remove photoresist, and if PMMA is used in the method as an immobilization layer, then removal of the photoresist (with acetone or a similar solvent) will also remove the immobilization layer. For some fabrication processes, such a simultaneous dual removal (of photoresist and the immobilization layer) may be acceptable, or even desirable in terms of both time and material efficiency. However, if the photoresist and immobilization layer would preferably be removed separately, an immobilization layer such as PDMS may be preferable. PDMS is typically removed using the solvent tetra-n-butylammonium fluoride (TBAF).

The solvent used to dissolve the immobilizing layer is typically also used to store the released free-standing two-sided devices. In the exemplary system described above where PDMS is the immobilizing layer, TBAF is used to dissolve the PDMS layer and release the components. The components are then captured (for example, by filtration) and then stored (for example, in a vial) in water. As described above, the free-standing devices can then be used in an assembly method, such as fluidic self-assembly, for assembling more complex structures, including macroelectronic devices.

In one embodiment, a device fabricated by the method of invention is provided. The device is fabricated on a substrate having a first device side and a second device side, wherein the first device side is opposite the second device side, and wherein the device has features disposed on both the first device side and the second device side. In a further embodiment, the device is a photosensor having a plurality of electrodes patterned on the first device side and an interference filter deposited on the second side of the device.

In another aspect, a semiconductor device is provided that is fabricated from a silicon-on-insulator substrate including a device layer, a buried oxide layer, and a carrier layer, wherein the device is fabricated in the device layer, the device having device features disposed on both a top side of the device and a bottom side of the device, and wherein the features on the bottom side of the device are formed after removal of the buried oxide layer and the carrier layer.

In another aspect, a device is provided that is fabricated on a substrate having a first device side and a second device side, wherein the first device side is opposite the second device side, wherein the device has features disposed on both the first device side and the second device side, wherein the substrate has a thickness dimension of less than about 50 microns.

Devices have features patterned on two opposite sides of a device substrate. The method described above enables the patterning of features on a first and second side of the device substrate. Traditional semiconductor processing techniques cannot produce devices such as those described herein. By "flipping" the substrate, as aided by the immobilization layer technique described above, two sides of a device substrate can be processed by microfabrication techniques. The materials used to form the substrate of the device are not typically important and include semiconductors, insulators, conductors, and compounds of one or more of the previous material types.

A "processed feature," as used herein, refers to a feature on a surface of a substrate that has been formed using two or more microfabrication techniques. Microfabrication techniques have been described above and are known to those of skill in the art. Exemplary process features include an interference-based electromagnetic filter deposited by lift off mask photolithography and alternating thin film deposition methods. An additional exemplary process feature is an electrode structure deposited using metal deposition, photolithography, and metal etching.

Because the components are typically useful in fluidic self-assembly of macroelectronic components, the components provided herein are typically nanometers or micrometers thick, and micrometers in length and width. In one embodiment, the components are less than 500 microns thick. In a preferred embodiment, the components are less than 50 microns thick. In a further preferred embodiment, the components are less than 10 microns thick. Such thin substrates result in unusually small free-standing components and consume an economic amount of substrate in production when compared to traditional components of the same type.

The types of devices that can be fabricated on each of the two sides of the components include such electrical, optical, and electro-optical devices as transistors, diodes, resistors, light emitting diodes (LEDs), and photosensors. Some device structures, such as those illustrated as the free-standing component 260 illustrated in FIG. 2H, can be useful as multiple types of components. The component in FIG. 2H, 260, includes processed features on both a first side and second side, including an interference filter 265 and electrodes 219. The p-n junction 270 created by the different doping types of the substrate 211 and doped regions 217 results in a component that can be used as both a photosensor and a light emitting diode, depending on the biasing of the electrodes 219. If the component 260 is used as a photosensor, the filter 265 will limit the light impinging on the photosensor to a particular spectrum, whereas if the component 260 is used as a light emitting diode, the filter 265 will act to filter out a portion of the spectrum emitted by the device 260.

A free-standing die can include one or more devices. A single device structure 260 on a die is illustrated in FIG. 2H. The single device structure 260 includes features patterned on both sides of the device which operate in tandem to produce a single effect (e.g., photosensing). It will be appreciated that each side may have its own independently functioning component or device, and each side may have multiple features patterned on a side that form one or more devices, some of which may act in conjunction with features formed on the opposite side of the device.

In another aspect, a free-standing photosensor is provided, comprising a first side having an outer electrode surrounding an inner electrode and a second side having an electromagnetic filter, wherein the photosensor is adapted for self-assembly onto a substrate through a self-assembly means.

Photosensor devices are provided having features patterned on both sides of a device substrate. As described in the method above, electrodes are patterned on a first side of a device substrate, and an electromagnetic filter is patterned on the second side of the device substrate. The device substrate itself is a semiconductor material having either n- or p-doping, and at least one region beneath an electrode in the substrate has the opposite doping as that of a substrate. The resulting junction between p- and n-type semiconductors yields a photosensor device structure. The photosensor is driven by the electrodes, which are interfaced with the proper equipment for detecting a photosignal (e.g., a multimeter). The filter can be customized to select the spectrum of light allowed to pass through the filter and impinge on the device sensing structure. A typical photosensor is illustrated in FIG. 2H, with the photosensor 260 having electrodes 219, a filter 265, a substrate 211, and doped regions 217.

The photosensor can be fabricated from any material that can produce a photo current. Typically, crystalline, semicrystalline, or long crystalline semiconducting materials are used to fabricate photosensors. Typical photosensing materials include silicon, gallium arsenide (GaAs), aluminum gallium arsenide (AlGaAs), indium phosphide (InP), and silicon germanium (SiGe). The type of material, as well as type of filter used for a photosensor, are known to those of skill in the art. For example, different materials, as described above, have greater or lesser sensitivities in spectral regions such as visible, infrared, and ultraviolet. Additionally, materials may be selected for the speed at which they react to impinging light.

While illustrative embodiments have been illustrated and described, it will be appreciated that various changes can be made therein without departing from the spirit and scope of the invention.

The embodiments of the invention in which an exclusive property or privilege is claimed are defined as follows:

1. A device fabricated on a substrate having a first device side and a second device side, wherein the first device side is opposite the second device side, wherein the device has features disposed on both the first device side and the second device side, wherein the substrate has a thickness dimension of less than about 50 microns;
   wherein the device further comprises a plurality of electrodes on the first device side and an electromagnetic interference filter on the second device side, wherein the plurality of electrodes includes a first electrode type and a second electrode type, and wherein at least one of the first electrode type is disposed adjacent to a portion of the substrate having a first doping that is different from a bulk doping of the substrate.

2. The device of claim 1, wherein the substrate is selected from the group consisting of crystalline and polycrystalline semiconductors, glass, polymer, ceramics, and combinations thereof.

3. The device of claim 1, wherein the device is a free-standing optoelectronic device.

4. The device of claim 1, wherein the features on the first device side and the second device side are in communication.

5. The device of claim 4, wherein the communication is selected from the group consisting of optical and electronic.

6. The device of claim 4, wherein the communication is through the substrate.

7. The photosensor of claim 1, wherein at least one of the plurality of electrodes is annular.

8. A free-standing photosensor comprising a substrate, a first side having an outer electrode surrounding an inner electrode, and a second side having an electromagnetic filter, wherein the electromagnetic filter is an interference filter formed from alternating layers of at least two materials, and wherein the at least two materials have different dielectric constants.

9. The photosensor of claim 8, wherein the photosensor has a thickness dimension of about 50 microns or less.

10. The photosensor of claim 8, wherein the substrate is selected from the group consisting of crystalline and polycrystalline semiconductors, glass, polymer, ceramics, and combinations thereof.

11. The photosensor of claim 8, wherein the photosensor is adapted for fluidic self-assembly.

12. The photosensor of claim 8, wherein the outer electrode is annular.

13. A free-standing photosensor comprising a substrate, a first side having an outer electrode surrounding an inner electrode, and a second side having an electromagnetic filter, wherein the outer electrode is annular.

14. The photosensor of claim 13, wherein the photosensor has a thickness dimension of about 50 microns or less.

15. The photosensor of claim 13, wherein the substrate is selected from the group consisting of crystalline and polycrystalline semiconductors, glass, polymer, ceramics, and combinations thereof.

16. The photosensor of claim 13, wherein the photosensor is adapted for fluidic self-assembly.

\* \* \* \* \*